(12) United States Patent
Fan et al.

(10) Patent No.: US 8,853,076 B2
(45) Date of Patent: Oct. 7, 2014

(54) SELF-ALIGNED CONTACTS

(75) Inventors: Su Chen Fan, Cohoes, NY (US); David V. Horak, Essex Junction, VT (US); Shom Ponoth, Gaithersburg, MD (US); David L. Rath, Stormville, NY (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/607,856

(22) Filed: Sep. 10, 2012

(65) Prior Publication Data

US 2014/0070282 A1    Mar. 13, 2014

(51) Int. Cl.
*H01L 21/44* (2006.01)

(52) U.S. Cl.
USPC .......................................... 438/666

(58) Field of Classification Search
None
See application file for complete search history.

(56) References Cited

U.S. PATENT DOCUMENTS

| | | |
|---|---|---|
| 5,153,754 A | 10/1992 | Whetten |
| 5,464,500 A | 11/1995 | Tsujimura et al. |
| 5,912,506 A | 6/1999 | Colgan et al. |
| 6,855,639 B1 | 2/2005 | Brask et al. |
| 7,595,248 B2 | 9/2009 | Hattendorf et al. |
| 2001/0001506 A1 | 5/2001 | Dennison |
| 2005/0176250 A1 | 8/2005 | Takahashi et al. |
| 2009/0057730 A1 | 3/2009 | Furukawa et al. |
| 2009/0131295 A1 | 5/2009 | Cui |
| 2010/0013009 A1* | 1/2010 | Pan ............................. 257/330 |
| 2010/0038723 A1 | 2/2010 | Babich et al. |
| 2011/0108930 A1 | 5/2011 | Cheng et al. |
| 2011/0114942 A1 | 5/2011 | Akimoto et al. |
| 2013/0260548 A1* | 10/2013 | Park ............................. 438/592 |

FOREIGN PATENT DOCUMENTS

| | | |
|---|---|---|
| JP | 2000243953 A | 9/2000 |
| KR | 20020003893 A | 1/2002 |

OTHER PUBLICATIONS

Verhaar et al. "A 25 μm2 Bulk Full CMOS SRAM Cell Technology with Fully Overlapping Contacts", Technical Digest, International Electron Devices Meting, IEDM '90 Dec. 9-12, 1990, pp. 473-476.
PCT International Search Report and Written Opinion for the International application No. PCT/US2013/050030, dated Oct. 18, 2013, 10 pages.

* cited by examiner

*Primary Examiner* — Scott B Geyer
(74) *Attorney, Agent, or Firm* — Yuanmin Cai; Roberts Mlotkowski Safran & Cole, P.C.

(57) ABSTRACT

Self-aligned contacts in a metal gate structure and methods of manufacture are disclosed herein. The method includes forming a metal gate structure having a sidewall structure. The method further includes recessing the metal gate structure and forming a masking material within the recess. The method further includes forming a borderless contact adjacent to the metal gate structure, overlapping the masking material and the sidewall structure.

17 Claims, 4 Drawing Sheets

SELF-ALIGNED CONTACTS

FIELD OF THE INVENTION

The invention relates to semiconductor structures and methods of manufacture and, more particularly, to self-aligned contacts in a metal gate structure and methods of manufacture.

BACKGROUND

Complementary metal-oxide-semiconductor (CMOS) technologies can be used for constructing integrated circuits of many types. For example, CMOS technology is used in microprocessors, microcontrollers, static RAM, and other digital logic circuits, as well as analog circuits such as image sensors, data converters, and highly integrated transceivers for many types of communication.

In CMOS technologies, a metal gate electrode is formed on top of a gate dielectric material, e.g., high-k dielectric material, which, in turn, is formed on top of a semiconductor material. Aluminum can be used as the metal gate material, in combination with a workfunction metal acting as a liner. A contact can then be formed adjacent to the metal gate material. The contact can be, for example, a borderless or self-aligned contact.

SUMMARY

In a first aspect of the invention, a method comprises forming a metal gate structure having a sidewall structure. The method further comprises recessing the metal gate structure and forming a masking material within the recess. The method further comprises forming a borderless contact adjacent to the metal gate structure, overlapping the masking material and the sidewall structure.

In another aspect of the invention, a method comprises forming a metal gate structure comprising an aluminum gate electrode, lined with a workfunction metal liner. The method further comprises recessing the metal gate structure by oxidizing the aluminum to form $Al_2O_3$, followed by etching of the $Al_2O_3$ and workfunction metal liner. The method further comprises forming a masking material within the recess. The method further comprises forming a borderless contact adjacent to the metal gate structure, overlapping the masking material.

In yet another aspect of the invention, a structure comprises a metal gate structure comprising an aluminum electrode and a workfunction liner, located between sidewall structure. The structure further comprises a blocking material located within a recess formed in the aluminum electrode and the workfunction liner. The structure further comprises a borderless contact overlapping the metal gate structure and contacting the sidewall structure and the blocking material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures, which comprises the structures of the present invention. In still further embodiments, a method in a computer-aided design system is provided for generating a functional design model of the semiconductor structures. The method comprises generating a functional representation of the structural elements of the semiconductor structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to self-aligned contacts in a metal gate structure and methods of manufacture. More specifically, the present invention relates to the formation of a borderless or self-aligned contact in a metal gate structure. In embodiments, the present invention provides a recess formation process, which will circumvent galvanic effects between a workfunction metal and a metal gate material. After formation of the recess, a masking material can be formed within the recess, which will prevent electrical shorting between the contact and the metal gate, itself. Accordingly, advantageously, the present invention provides a process for preventing gate to contact short through borderless or self-aligned contacts.

In more specific embodiments, the present invention provides a controlled aluminum wet recess process for self-aligned or borderless contacts. In embodiments, the metal gate stack includes an aluminum stack having a TiN layer. The recess formation process includes, for example, oxidation of the aluminum, e.g., using hydrogen peroxide ($Al_2O_3$), followed by a wet etch removal of $Al_2O_3$ using a phosphoric/nitric/acetic acid (PNA) mixture. The PNA mixture will also remove the TiN layer. The above steps can be repeated until a desired aluminum recess depth is reached. A masking material, e.g., nitride, can then be deposited within the recess in order to protect shorting of the aluminum with a contact metal.

Figure 1:
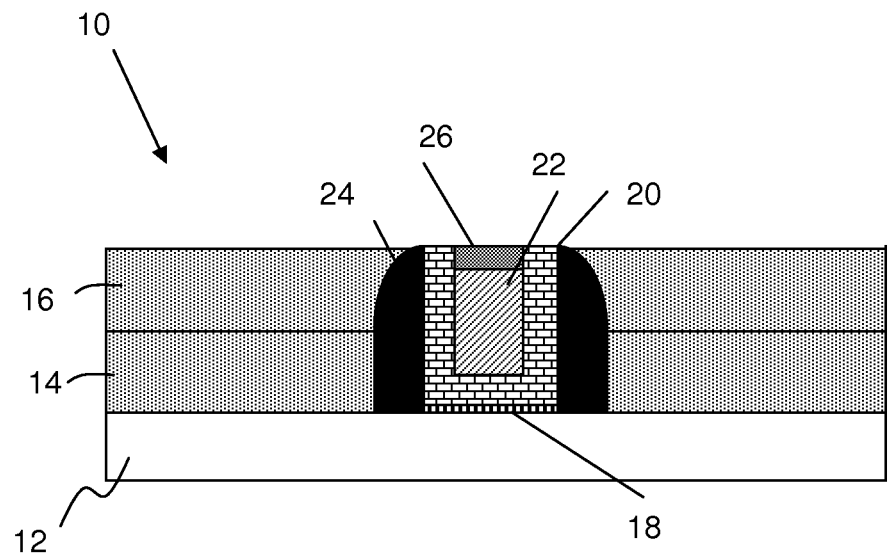
FIGS. 1-5 show structures and respective processing steps in accordance with aspects of the present invention.

FIG. 1 shows an intermediate structure and respective processing steps in accordance with aspects of the present invention. In particular, FIG. 1 shows a gate structure, generally represented as reference numeral 10. In embodiments, the gate structure 10 can be an NFET, PFET, a FINFet structure or other conventional replacement gate structure used in a borderless contact configuration, in accordance with aspects of the present invention. The gate structure 10 of the present invention can be formed using conventional deposition, lithography and etching processes, either in a gate-first or gate-last process, as should be understood by those of ordinary skill in the art.

In embodiments, the gate structure 10 can be formed on a substrate 12. The substrate 12 can be any substrate, e.g., silicon. An interlevel dielectric layer 14 is formed on the substrate 12 using, for example, conventional deposition methods, e.g., chemical vapor deposition (CVD). In embodiments, the interlevel dielectric layer 14 can be, for example, an oxide material. A second interlevel dielectric layer 16 is formed, e.g., deposited, on the interlevel dielectric layer 14. The second interlevel dielectric layer 16 can also be an oxide material.

Still referring to FIG. 1, a gate dielectric material 18 can be formed on the substrate 12. In embodiments, the gate dielectric material 18 is a high-k dielectric material such as, for example, a hafnium oxide or other hafnium based material. In embodiments, the gate dielectric material 18 can be deposited using a conventional CVD process. For example, the dielectric material 18 can be deposited within a trench formed after removal of the replacement dummy gate (or, alternatively, prior to the formation of the replacement dummy gate). The thickness of the gate dielectric material 18 can vary depending on the required device performance.

A metal liner 20 is formed on the gate dielectric material 18 and sidewall structures 24. In embodiments, the metal liner 20 is a workfunction metal which may be, for example, TiN or TaN; although other workfunction metals are also contemplated by the present invention. In embodiments, the metal liner 20 can have a thickness of about 5 nm; although other dimensions are also contemplated by the present invention. A metal gate material 22 is then formed on the metal material 20. In embodiments, the metal gate material 22 is Al, having a width of about 6 nm; although other dimensions are also contemplated by the present invention. Sidewalls 24 are formed on the metal liner 20, which may be a nitride material. The sidewalls 24 may be formed during dummy gate (replacement gate) processes, e.g., prior to the deposition of the materials 20, 22, as should be understood by those of skill in the art. In embodiments, aluminum will oxide during subsequent processes, e.g., chemical mechanical planarization processes, to form an aluminum oxide 26 layer ($Al_2O_3$).

Figure 2:
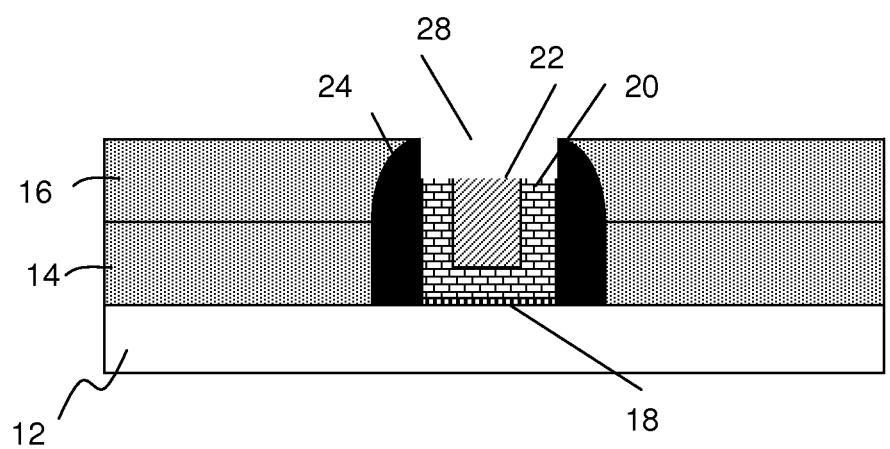

In FIG. 2, a recess 28 is formed by etching the materials 20, 22 (and $Al_2O_3$) to a depth of about 15 nm to about 45 nm, more preferably about 20 nm to 45 nm, and even more preferably about 20 nm to about 30 nm. As should be understood by those of skill in the art, as the materials 20, 22 etch at different rates, and due to the material properties and galvanic corrosion, the metal gate material 22 (e.g., Al) will etch faster than the metal liner 20 (e.g., TiN, TaN). Due to the different etch rates, e.g., Al being a very reactive metal for wet processes, the Al can be completely etched or removed, prior to adequate removal of the workfunction metal 20. By way of example, Al can etch at a rate 3× faster when in contact with TiN. In one specific example, a 12 second conventionally known wet etch process will not impact the Al (no etching will result), whereas a 30 second conventionally known wet etch process will provide a minimum recess, whereas a 60 second conventionally known wet etch process can effectively remove all of the Al. Accordingly, as described in more detail herein, the etching processes of the present invention, which form the recess 26, are tailored for the materials 20, 22.

More specifically, it has been found by the inventors that it is difficult to control the etching process of the Al due to galvanic effects, i.e., Al and TiN or TaN being in contact. Galvanic corrosion is an electrochemical process in which one metal corrodes preferentially to another when both metals are in electrical contact and immersed in a wet etchant; that is, the TiN accelerates the Al recess etching, whereas, the Al slows the TiN etching. Due to this phenomena, selective Al etching becomes very difficult to control, and is affected by progressive increase in surface area of TiN (or TaN), resulting in enhanced aluminum etching.

To solve the above problems, the recess 28 is etched using a sequential wet etching process, in order to circumvent the galvanic effect. The sequential etching process includes the use of $H_2O_2$ solution and Phosphoric/Nitric/Acetic acid (PNA) mixture. In embodiments, the $H_2O_2$ solution will oxidize the Al, thus forming $Al_2O_3$, which, in turn, can be etched together with the metal liner 20 in a more controllable manner using the PNA mixture.

In more specific embodiments, the present invention contemplates a 20% $H_2O_2$ solution followed by the PNA mixture. In embodiments, the PNA mixture has a ratio of 30:1:1:150 of Phosphoric/Nitric/Acetic acid and deionized water. In even more specific embodiments, the present invention contemplates a 20% $H_2O_2$ solution at 50° C. for 30 seconds, followed by the PNA mixture. In even further specific embodiments, the present invention contemplates a 20% $H_2O_2$ solution at 50° C. for 30 seconds, followed by the PNA mixture at 50° C. for 30 seconds. This sequence will achieve a recess of both the materials 20, 22 (e.g., more specifically, $Al_2O_3$ and liner 20) of about 15 nm.

In still further specific embodiments, the present invention contemplates repetitively using the $H_2O_2$ and PNA mixture, until a desired recess depth is achieved. In embodiments, the etching process can use the following sequential cycle to achieve a depth of about 30 nm:
  (i) 20% $H_2O_2$ solution at 50° C. for 30 seconds,
  (ii) PNA mixture at 50° C. for 30 seconds,
  (iii) 20% $H_2O_2$ solution at 50° C. for 30 seconds, and
  (iv) PNA mixture at 50° C. for 30 seconds.

Figure 3:
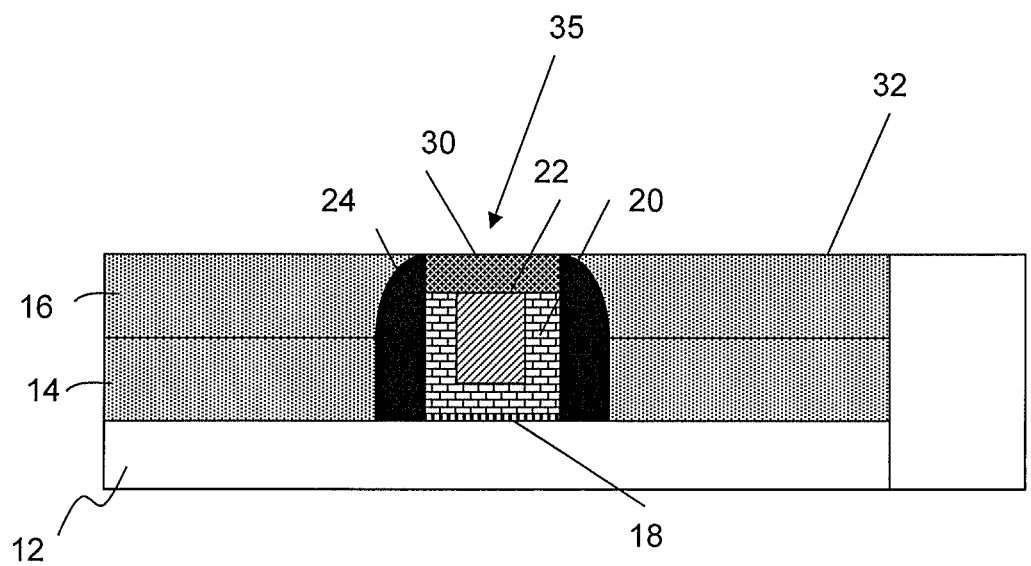

Referring to FIG. 3, a masking material 30 is formed within the recess (recess 28) and on a surface of the interlevel dielectric material 16. The masking material 30 can be, for example, a nitride material which is used to prevent shorting between the metal gate material 22 and subsequent formation of a contact (see, e.g., FIGS. 4 and 5). In embodiments, the masking material 30 is deposited using, for example, a CVD process or atomic layer deposition (ALD) process. After deposition, the masking material 30 is planarized to remove the material from the interlevel dielectric material 16, thus forming an exposed planar surface 32. The planarization process can be, for example, a chemical mechanical planarization (CMP) process. As seen in FIG. 3, the masking material 30 will remain within the recess after the CMP process, thus completing a metal gate structure 35, e.g., gate dielectric material 18, metal liner 20, metal gate 22, masking material 30 and sidewalls 24.

Figure 4:
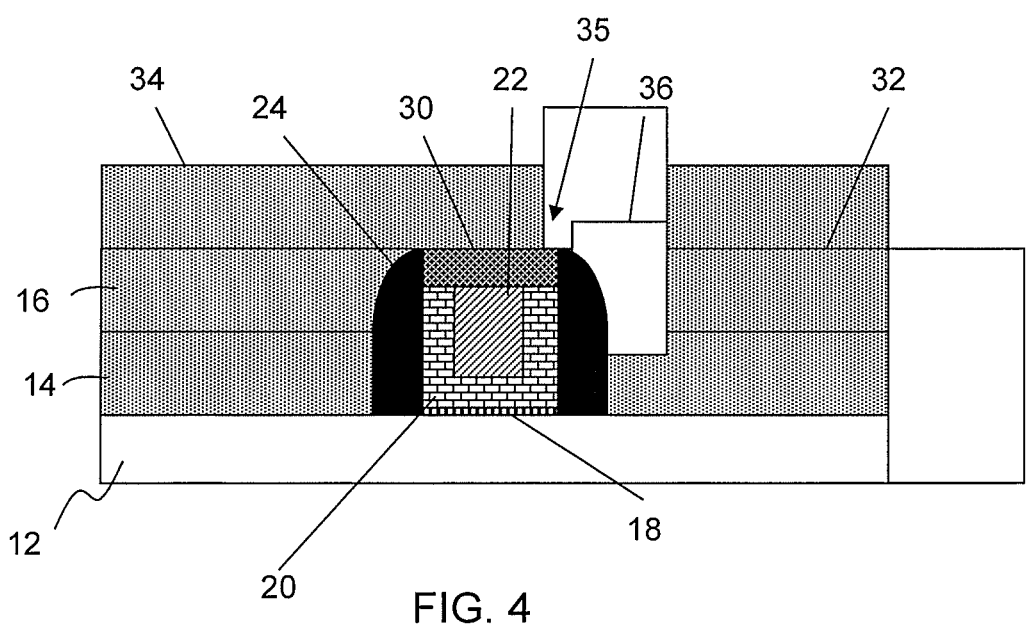

In FIG. 4, an interlevel dielectric material 34 is formed over the planar surface 32 of the interlevel dielectric material 16 and the masking material 30. In embodiments, the interlevel dielectric material 34 is an oxide material, which is deposited using, e.g., CVD processes. A trench 36 is formed through the interlevel dielectric material 34, which may extend into the interlevel dielectric materials 14, 16. In embodiments, the trench 36 overlaps with the metal gate structure 35, e.g., masking material 30 and sidewalls 26. In embodiments, the trench 36 can be formed using any conventional lithography and etching process, known to those of skill in the art.

Figure 5:
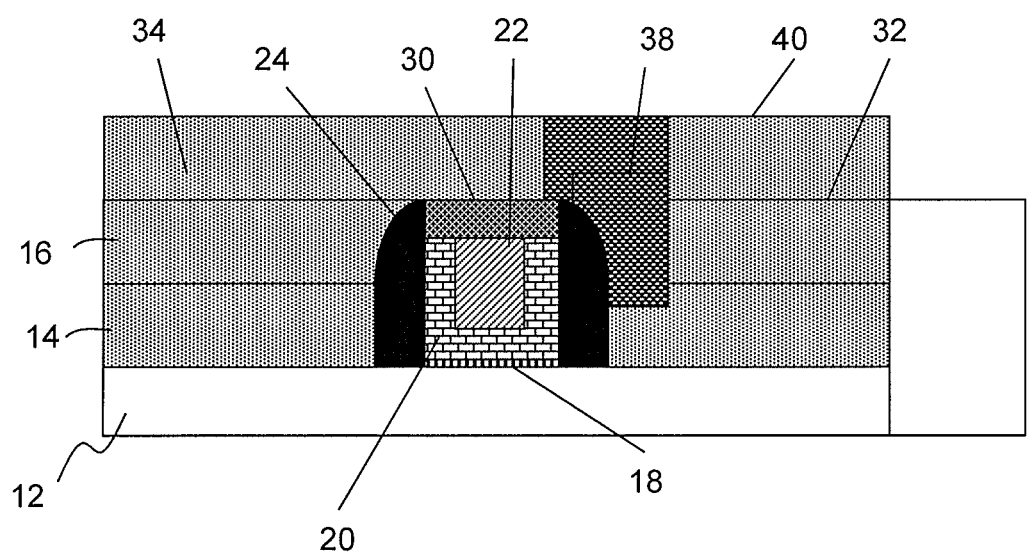

In FIG. 5, a self-aligned borderless contact 38 is formed within the trench 35 using conventional deposition processes. In embodiments, the self-aligned borderless contact 38 is a metal material, e.g., Al or tungsten. In embodiments, the self-aligned borderless contact 38 is formed by a deposition process using, for example, CVD or ALD processes; although other deposition processes are also contemplated by the present invention. The metal material forming the contact 38 can be planarized to form a planar surface 40.

As seen in FIG. 5, the metal material forming the self-aligned borderless contact 38 does not make any contact (electrical contact) with the metal gate material 22 or the metal liner 20, as they are protected by the masking material 30. In this way, a borderless contact can be formed within a metal gate process, which prevents a gate to contact short.

Figure 6:
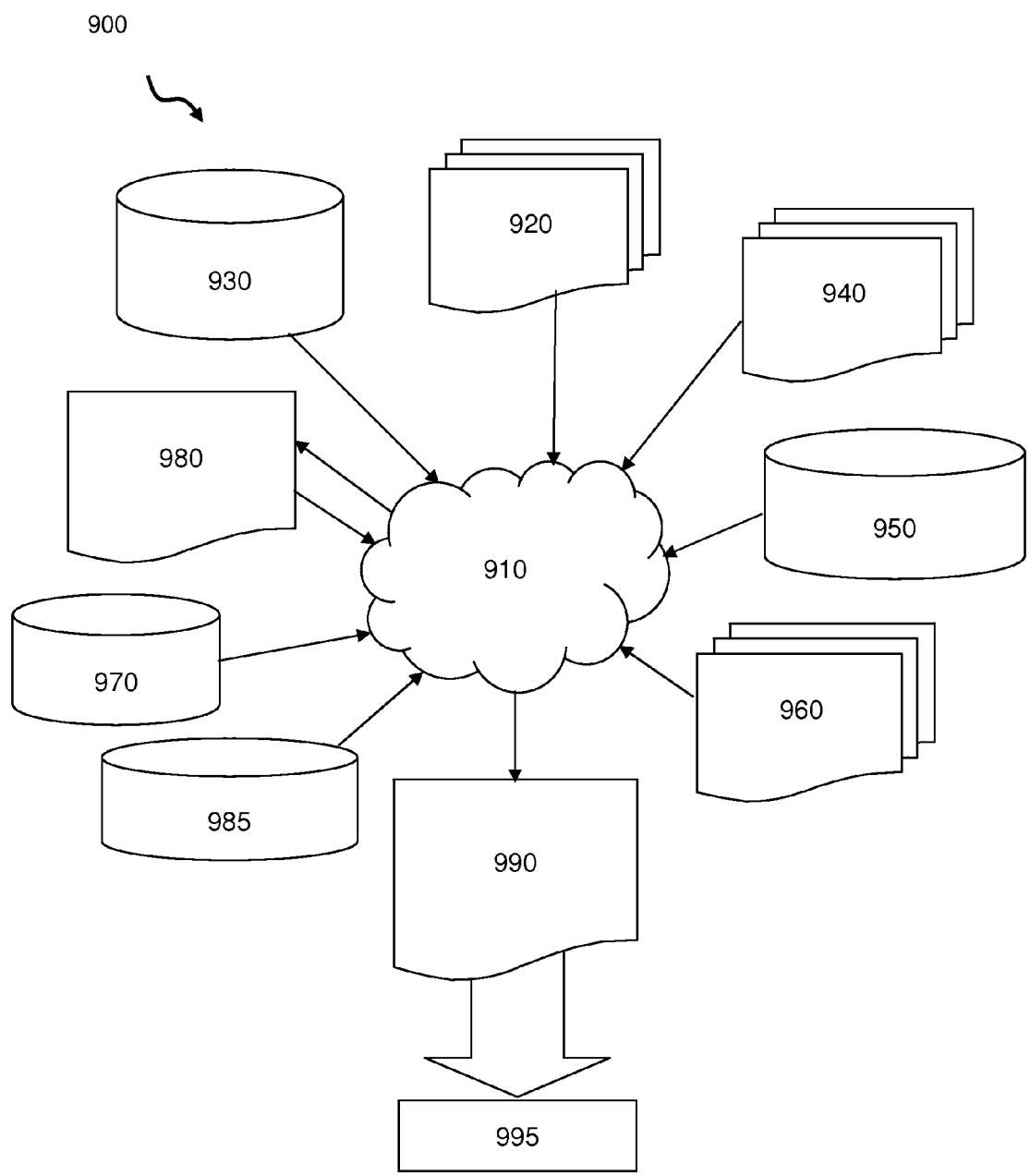
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a metal gate structure having a sidewall structure;
    recessing the metal gate structure;
    forming a masking material within the recess; and
    forming a borderless contact adjacent to the metal gate structure, overlapping the masking material and the sidewall structure, wherein
    the metal gate structure comprises aluminum and a workfunction metal liner formed from one of TiN and TaN, and
    the recessing comprises:
        oxidizing the aluminum to form $Al_2O_3$; and
        etching the $Al_2O_3$ and workfunction metal liner.

2. The method of claim 1, wherein the oxidizing comprises subjecting the aluminum to $H_2O_2$.

3. The method of claim 2, further comprising removing the oxidized aluminum and the workfunction metal liner using a Phosphoric/Nitric/Acetic acid (PNA) mixture.

4. The method of claim 3, wherein the $H_2O_2$ solution is a 20% $H_2O_2$ solution, followed by the PNA mixture.

5. The method of claim 2, wherein the aluminum is subject to a 20% $H_2O_2$ solution at 50° C. for 30 seconds, followed by the PNA mixture at 50° C. for 30 seconds.

6. The method of claim 5, further comprising a second cycle of 20% $H_2O_2$ solution at 50° C. for 30 seconds, followed by a second cycle of the PNA mixture at 50° C. for 30 seconds.

7. The method of claim 5, wherein the PNA mixture has a ratio of 30:1:1:150 of Phosphoric/Nitric/Acetic acid and deionized water.

8. A method, comprising:
    forming a metal gate structure having a sidewall structure;
    recessing the metal gate structure;
    forming a masking material within the recess; and
    forming a borderless contact adjacent to the metal gate structure, overlapping the masking material and the sidewall structure,
    wherein the recess is formed to a depth of about 20 nm to 30 nm.

9. A method, comprising:
    forming a metal gate structure comprising an aluminum gate electrode, lined with a workfunction metal liner;
    recessing the metal gate structure by oxidizing the aluminum to form $Al_2O_3$, followed by etching of the $Al_2O_3$ and workfunction metal liner;
    forming a masking material within the recess; and
    forming a borderless contact adjacent to the metal gate structure, overlapping the masking material.

10. The method of claim 9, wherein the workfunction metal liner is formed from one of TiN and TaN.

11. The method of claim 9, wherein the oxidizing comprises subjecting the aluminum to $H_2O_2$.

12. The method of claim 11, further comprising subjecting the oxidized aluminum and the workfunction metal liner to a Phosphoric/Nitric/Acetic acid (PNA) mixture.

13. The method of claim 11, wherein the $H_2O_2$ solution is a 20% $H_2O_2$ solution, followed by a PNA mixture.

14. The method of claim 13, wherein the aluminum is subject to the 20% $H_2O_2$ solution at 50° C. for 30 seconds, followed by the PNA mixture at 50° C. for 30 seconds.

15. The method of claim 14, wherein the recessing further comprises a second cycle of 20% $H_2O_2$ solution at 50° C. for 30 seconds, followed by a second cycle of the PNA mixture at 50° C. for 30 seconds.

16. The method of claim 15, wherein the PNA mixture has a ratio of 30:1:1:150 of Phosphoric/Nitric/Acetic acid and deionized water.

17. A structure comprising:
    a metal gate structure comprising an aluminum electrode and a workfunction liner, located between sidewall structure;
    a blocking material located with a recess formed in the aluminum electrode and the workfunction liner and in direct contact therewith; and
    a borderless contact overlapping the metal gate structure and directly contacting the sidewall structure and the blocking material.

* * * * *